United States Patent
Lee (10) Patent No.: US 10,134,821 B2
(45) Date of Patent: Nov. 20, 2018

(54) TFT SUBSTRATE, ORGANIC LIGHT-EMITTING DIODE (OLED) DISPLAY INCLUDING THE SAME, METHOD OF MANUFACTURING TFT SUBSTRATE, AND METHOD OF MANUFACTURING OLED DISPLAY

(71) Applicant: Samsung Display Co., Ltd., Yongin, Gyeonggi-Do (KR)

(72) Inventor: Dong-Won Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 22 days.

(21) Appl. No.: 14/137,335

(22) Filed: Dec. 20, 2013

(65) Prior Publication Data
US 2015/0001490 A1    Jan. 1, 2015

(30) Foreign Application Priority Data
Jun. 26, 2013 (KR) .................. 10-2013-0073961

(51) Int. Cl.
| | |
|---|---|
| *H01L 27/32* | (2006.01) |
| *H01L 51/56* | (2006.01) |
| *H01L 27/12* | (2006.01) |
| *H01L 29/786* | (2006.01) |

(52) U.S. Cl.
CPC ...... *H01L 27/3262* (2013.01); *H01L 27/1248* (2013.01); *H01L 29/78636* (2013.01); *H01L 27/1262* (2013.01); *H01L 27/3258* (2013.01); *H01L 51/56* (2013.01); *H01L 2227/323* (2013.01); *H01L 2251/558* (2013.01)

(58) Field of Classification Search
CPC ............. H01L 27/3262; H01L 27/1222; H01L 27/1259; H01L 27/124; H01L 27/1214; H01L 27/3244; H01L 21/2026; H01L 27/3246; H01L 27/3258; H01L 27/1248; H01L 27/1262; H01L 2227/323; H01L 2251/558; H01L 51/56; H01L 27/3248; G02F 1/13454; G02F 1/136286; G02F 1/1339
USPC ......... 257/40, 59, 72, 103, E21.134; 438/23, 438/151; 349/138; 345/76
See application file for complete search history.

(56) References Cited

U.S. PATENT DOCUMENTS

| | | | | |
|---|---|---|---|---|
| 5,574,292 A | * | 11/1996 | Takahashi | ........... G02F 1/13454 257/103 |
| 5,866,919 A | * | 2/1999 | Kwon | ............... G02F 1/136209 257/59 |
| 6,271,897 B1 | | 8/2001 | Ichikawa et al. | |

(Continued)

FOREIGN PATENT DOCUMENTS

| | | |
|---|---|---|
| KR | 10-2007-0096702 A | 10/2007 |
| KR | 10-2008-0065933 A | 7/2008 |

(Continued)

*Primary Examiner* — Mary Wilczewski (57) ABSTRACT

A thin film transistor (TFT) substrate having reduced differences in heights in areas thereof so as to facilitate subsequent processing is disclosed. In one aspect, the TFT substrate includes a substrate having a first area in which a TFT is not disposed and a second area in which a TFT is disposed, a height adjustment layer disposed on the substrate in an area corresponding to at least a part of the first area. The TFT substrate also includes a TFT disposed on the substrate in an area corresponding to the second area.

13 Claims, 7 Drawing Sheets

(56) References Cited

U.S. PATENT DOCUMENTS

| | | | | |
|---|---|---|---|---|
| 6,774,399 | B2* | 8/2004 | Hirata | H01L 27/12 257/59 |
| 6,872,607 | B2* | 3/2005 | Tanaka | H01L 21/2026 257/E21.134 |
| 6,958,251 | B2* | 10/2005 | Yamazaki | H01L 27/1214 257/E21.134 |
| 8,076,844 | B2 | 12/2011 | Oda et al. | |
| 8,218,110 | B2* | 7/2012 | Song | G02F 1/136209 349/106 |
| 8,415,675 | B2 | 4/2013 | Im et al. | |
| 8,487,310 | B2 | 7/2013 | Kang et al. | |
| 8,665,413 | B2* | 3/2014 | Lee | G02F 1/13392 349/155 |
| 8,704,993 | B2* | 4/2014 | Lee | G09G 3/36 349/110 |
| 9,046,727 | B2* | 6/2015 | Lee | G02F 1/136209 |
| 9,269,729 | B2* | 2/2016 | Lee | G02F 1/136209 |
| 9,502,484 | B2* | 11/2016 | Lee | H01L 27/3258 |
| 9,570,477 | B2* | 2/2017 | Lee | G02F 1/136209 |
| 9,595,694 | B2* | 3/2017 | Lee | H01L 51/56 |
| 9,618,800 | B2* | 4/2017 | Hao | G02F 1/13394 |
| 9,954,015 | B2* | 4/2018 | Park | H01L 27/1248 |
| 2002/0011975 | A1* | 1/2002 | Yamazaki | G02F 1/1339 345/76 |
| 2002/0149018 | A1* | 10/2002 | Hirata | H01L 27/12 257/72 |
| 2003/0082889 | A1 | 5/2003 | Maruyama et al. | |
| 2004/0218133 | A1* | 11/2004 | Park | G02F 1/133305 349/153 |
| 2006/0011921 | A1 | 1/2006 | Park et al. | |
| 2007/0171352 | A1* | 7/2007 | Matsuyama | G02F 1/13394 349/156 |
| 2007/0257253 | A1 | 11/2007 | Im et al. | |
| 2008/0024402 | A1* | 1/2008 | Nishikawa | H01L 51/5209 345/82 |
| 2010/0051951 | A1* | 3/2010 | Lee | G02F 1/136209 257/59 |
| 2010/0149476 | A1* | 6/2010 | Kim | G02F 1/136286 349/138 |
| 2010/0155905 | A1* | 6/2010 | Fukushima | H01L 21/2007 257/618 |
| 2011/0163331 | A1 | 7/2011 | Yamazaki et al. | |
| 2011/0241219 | A1* | 10/2011 | Nakazawa | G02F 1/13454 257/774 |
| 2012/0097952 | A1 | 4/2012 | Kang et al. | |
| 2012/0099042 | A1* | 4/2012 | Lee | G02F 1/13392 349/43 |
| 2012/0104396 | A1* | 5/2012 | Pyo | H01L 27/124 257/59 |
| 2014/0097455 | A1* | 4/2014 | Ono | H01L 27/124 257/91 |
| 2014/0175396 | A1* | 6/2014 | Lee | H01L 51/56 257/40 |
| 2015/0001490 | A1* | 1/2015 | Lee | H01L 27/3262 257/40 |
| 2015/0001492 | A1* | 1/2015 | Lee | H01L 27/3258 257/40 |
| 2015/0198842 | A1* | 7/2015 | Kwak | H01L 27/1248 349/42 |
| 2015/0234224 | A1* | 8/2015 | Jang | G02F 1/13394 349/156 |
| 2015/0270296 | A1* | 9/2015 | Lee | G02F 1/136209 438/29 |
| 2016/0004111 | A1* | 1/2016 | Lee | H01L 27/3244 349/12 |
| 2016/0041441 | A1* | 2/2016 | Park | G02F 1/136209 349/43 |
| 2016/0181283 | A1* | 6/2016 | Lee | G02F 1/136209 257/72 |
| 2016/0187718 | A1* | 6/2016 | Shin | G02F 1/133512 349/110 |
| 2017/0102578 | A1* | 4/2017 | Shin | G02F 1/133512 |
| 2017/0199411 | A1* | 7/2017 | Kim | G02F 1/1333 |
| 2018/0143471 | A1* | 5/2018 | Park | G02F 1/1368 |

FOREIGN PATENT DOCUMENTS

| | | |
|---|---|---|
| KR | 10-2011-0025956 A | 3/2011 |
| KR | 10-2012-0043438 A | 5/2012 |

* cited by examiner

TFT SUBSTRATE, ORGANIC LIGHT-EMITTING DIODE (OLED) DISPLAY INCLUDING THE SAME, METHOD OF MANUFACTURING TFT SUBSTRATE, AND METHOD OF MANUFACTURING OLED DISPLAY

CROSS-REFERENCE TO RELATED APPLICATIONS

This application claims the benefit of Korean Patent Application No. 10-2013-0073961, filed on Jun. 26, 2013, in the Korean Intellectual Property Office, the disclosure of which is incorporated herein in its entirety by reference.

BACKGROUND

Field

The described technology generally relates to a thin film transistor (TFT) substrate, an organic light-emitting diode (OLED) display including the same, a method of manufacturing the TFT substrate, and a method of manufacturing the OLED display.

Description of the Related Technology

OLED displays generally include an OLED in a display area thereof. The OLED typically includes a pixel electrode and a counter electrode which face each other, and an intermediate layer including an emission layer interposed between the pixel electrode and the counter electrode.

OLED displays are generally classified into active matrix (AM) OLED displays and passive matrix (PM) OLED displays, according to their driving mechanism. In AMOLED displays, light emission in each sub-pixel is typically controlled through a thin film transistor (TFT) included in each sub-pixel. In PMOLED displays, light emission in each sub-pixel is typically controlled through an array of electrodes arranged in a substantially matrix form. In AMOLED displays, an OLED is typically located on the TFT.

SUMMARY OF CERTAIN INVENTIVE ASPECTS

One inventive aspect is a thin film transistor (TFT) substrate which has reduced differences in heights in areas thereof so as to facilitate subsequent processing, an OLED display including the TFT substrate, a method of manufacturing the TFT substrate, and a method of manufacturing the OLED display.

Another aspect is a TFT substrate including a substrate having a first area in which a TFT is not disposed and a second area in which a TFT is disposed, a height adjustment layer disposed on the substrate in an area corresponding to at least a part of the first area, and a TFT disposed on the substrate in an area corresponding to the second area.

The height of the height adjustment layer may correspond to the height of the TFT.

The height adjustment layer may further include a metal or an inorganic material.

The TFT substrate may further include a planarization layer disposed to cover the height adjustment layer and the TFT. In this case, the TFT substrate may further include a passivation layer disposed between the height adjustment layer and the TFT, and the planarization layer.

The height adjustment layer may include a first height adjustment layer and a second height adjustment layer which have different heights.

The height adjustment layer may include a first height adjustment layer and a second height adjustment layer which are separated from each other.

The TFT substrate may further include a buffer layer disposed on the substrate, wherein the height adjustment layer may be disposed on the buffer layer.

The TFT substrate may further include a gate insulating layer disposed on the substrate so as to be interposed between a semiconductor layer and a gate electrode of the TFT, wherein the height adjustment layer may be disposed on the gate insulating layer. Alternatively, the TFT substrate may further include an insulating interlayer disposed on the substrate so as to be interposed between source/drain electrodes and a gate electrode of the TFT, wherein the height adjustment layer may be disposed on the insulating interlayer.

The TFT substrate may further include a pixel electrode that is electrically connected to the TFT.

Another aspect is an OLED display including the TFT substrate, an intermediate layer disposed on the pixel electrode and including an emission layer, and a counter electrode disposed on the intermediate layer.

Light emitted from the emission layer may be emitted to the environment through the counter electrode.

Another aspect is a method of manufacturing a TFT substrate, the method including: preparing a substrate having a first area in which a TFT is not to be disposed and a second area in which a TFT is to be disposed, forming a height adjustment layer so as to correspond to at least a part of the first area of the substrate, and forming a TFT on the substrate so as to correspond to the second area of the substrate.

The forming of the height adjustment layer may include forming the height adjustment layer in such a manner that a height of the height adjustment layer corresponds to a height of the TFT.

The forming of the height adjustment layer may include using a metal or an inorganic material.

The forming of the TFT may include: forming a semiconductor layer, forming a gate insulating layer so as to cover the semiconductor layer, forming a gate electrode on the gate insulating layer, forming an insulating interlayer so as to cover the gate electrode, and forming source/drain electrodes on the insulating interlayer so as to be electrically connected to the semiconductor layer, wherein the forming of the height adjustment layer is performed before the forming of the semiconductor layer, is performed between the forming of the gate insulating layer and the forming of the insulating interlayer, or is performed after the forming of the insulating interlayer.

The method may further include forming a planarization layer so as to cover the height adjustment layer and the TFT.

The method may further include forming a passivation layer so as to cover the height adjustment layer and the TFT and forming a planarization layer on the passivation layer.

The method may further include removing the substrate.

The method may further include forming a pixel electrode so as to be electrically connected to the TFT.

Another aspect is a method of manufacturing an OLED display, the method including: preparing a TFT substrate that is manufactured using a method of manufacturing the TFT substrate, forming an intermediate layer including an emission layer on the pixel electrode, and forming a counter electrode on the intermediate layer.

The method may further include removing the substrate.

The forming of the intermediate layer may include a liquid phase process.

Another aspect is a method of manufacturing an OLED display, the method including: preparing a TFT substrate that is manufactured using a method of manufacturing the TFT substrate, forming an intermediate layer including an emission layer on the pixel electrode, and forming a counter electrode on the intermediate layer.

The forming of the intermediate layer may include a liquid phase process.

BRIEF DESCRIPTION OF THE DRAWINGS

These and/or other aspects will become apparent and more readily appreciated from the following description of embodiments, taken in conjunction with the accompanying drawings.

DETAILED DESCRIPTION OF CERTAIN INVENTIVE EMBODIMENTS

Generally, AMOLED displays generate defects in an OLED located on the upper side thereof due to the configuration of a TFT located on the lower side thereof, and have a problem where only a specific method is used to form the OLED located on the upper side.

The described technology will now be described more fully hereinafter with reference to the accompanying drawings, in which exemplary embodiments of the described technology are shown. The described technology may, however, be embodied in many different forms, and should not be construed as being limited to the embodiments set forth herein; rather, these embodiments are provided so that this disclosure will be thorough and complete, and will fully convey the concept of the described technology to one of ordinary skill in the art. In the drawings, the thicknesses of layers and areas may be exaggerated for clarity. Like reference numerals denote like elements throughout the specification. Throughout the specification, it will also be understood that when an element such as layer, area, or substrate is referred to as being "on" another element, it can be directly on the other element, or intervening elements may be present. In contrast, when an element is referred to as being "directly on" another element, there are no intervening elements present. Throughout the specification, the term "connected" includes "electrically connected." As used herein, the term "and/or" includes any and all combinations of one or more of the associated listed items. Expressions such as "at least one of," when preceding a list of elements, modify the entire list of elements and do not modify the individual elements of the list.

FIGS. 1 to 9 are schematic cross-sectional views illustrating a method of manufacturing an OLED display according to an embodiment.

Figure 1:
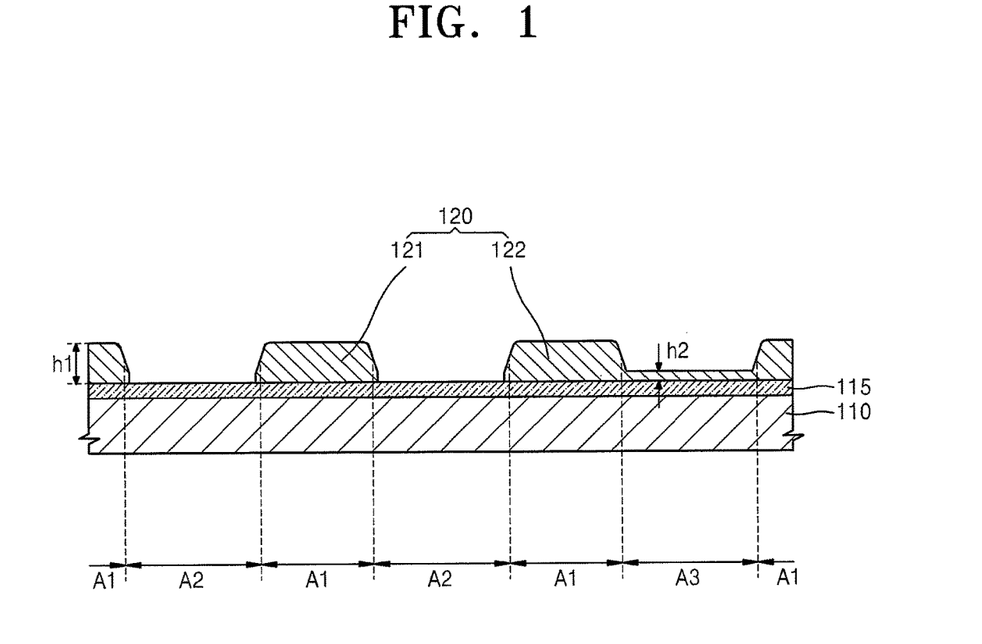
FIGS. 1 to 9 are schematic cross-sectional views illustrating a method of manufacturing an OLED display, according to an embodiment.

According to the method of manufacturing an OLED display of the current embodiment, first, as illustrated in FIG. 1, a height adjustment layer 120 is formed on a substrate 110. In addition, another layer such as a buffer layer 115 may be formed on the substrate 110 before forming the height adjustment layer 120, when necessary. The buffer layer 115 may be formed on the whole surface of the substrate 110, as illustrated in FIGS. 1 to 9, or may be formed in a pattern.

The substrate 110 may be formed of various materials, for example, a glass material, a metal material, or a plastic material such as polyethylene terephthalate (PET), polyethylene naphthalate (PEN), or polyimide. The substrate 110 includes a first area A1 in which a TFT is not to be formed, and a second area A2 in which a TFT is to be formed. The first and second areas A1 and A2 may be alternately included as illustrated in the drawing, but the interval between the first and second areas A1 and A2 and the areas thereof not required to be the same. The substrate 110 may have a third area A3 in which other wiring structures are to be disposed. The third area A3 may be understood as a part of the first area A1 in that the third area A3 is an area in which a TFT is not to be formed.

The buffer layer 115 may be formed of various materials, and may be formed to have a single-layered structure or a multi-layered structure using a material, such as PET, PEN, polyacrylate, or polyimide, in order to form a flexible display as described below. Alternatively, the buffer layer 115 may be formed using silicon oxide, silicon nitride, or the like, or the buffer layer 115 may be formed as a composite film including an organic material and an inorganic material.

When the height adjustment layer 120 is formed on the substrate 110, the height adjustment layer 120 is formed to correspond to at least a part of the first area A1 of the substrate 110. A height h1 of the height adjustment layer 120 may correspond to, for example, the height of a TFT to be described below.

The height adjustment layer 120 may be formed of, for example, a metal or an inorganic material. When the height adjustment layer 120 is formed of a metal, the height adjustment layer 120 may be formed using a material capable of being used when forming a gate electrode, which is a component of the TFT. That is, the height adjustment layer 120 may be formed to have a single-layered structure or a multi-layered structure using, for example, at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), or an arbitrary alloy type material. When the height adjustment layer 120 is formed of an inorganic material, the height adjustment layer 120 may be formed to have a single-layered structure or a multi-layered structure using a material, such as silicon oxide and/or silicon nitride.

As illustrated in FIGS. 1 to 9, the height adjustment layer 120 may include a first height adjustment layer 121 and a second height adjustment layer 122. Here, a third height adjustment layer separated from the first height adjustment layer 121 and/or the second height adjustment layer 122 may also be present. Since FIG. 1 is a cross-sectional view, the first and second height adjustment layers 121 and 122 are shown to be separated from each other in FIG. 1. However, the first and second height adjustment layers 121 and 122 may be connected to each other.

The height adjustment layer 120 may not always necessarily have a constant height. For example, as illustrated in FIG. 1, the second height adjustment layer 122 may have a portion having a height h1 that is substantially the same as the height of the first height adjustment layer 121, and a portion having a height h2 that is different from the height h1. In the second height adjustment layer 122, the portion having the height h1 and the portion having the height h2 may be separated from each other. The heights of the first and second height adjustment layers 122 may be different. In order to form the height adjustment layer 120 having various heights, the height adjustment layer 120 may be formed to have a multi-layered structure when necessary.

The height adjustment layer 120 may be formed on the substrate 110 so as to correspond to at least a part of the first area A1 of the substrate 110. For example, an area where pixels are disposed in the OLED display may be referred to as an active area and a non-emission area where pixels are not disposed may be referred to as a dead area. Here, a portion in which a TFT is not located in the dead area may be included in the first area A1 of the substrate 110. However, the height adjustment layer 120 may not necessarily be present in the portion of the first area A1. In this regard, it may be said that the height adjustment layer 120 is formed on the substrate 110 so as to correspond to at least a part of the first area A1 of the substrate 110.

In order to form the height adjustment layer 120, a layer may be formed on the whole surface of the substrate 110 or on the majority of the surface of the substrate 110 by using a material for forming the height adjustment layer 120, and then may be patterned. The layer may be patterned using various methods, for example, photolithography, a laser ablation technique (LAT), or a halftone mask. Alternatively, the height adjustment layer 120 may be formed by deposition using a mask, a halftone mask, or the like.

Figure 2:
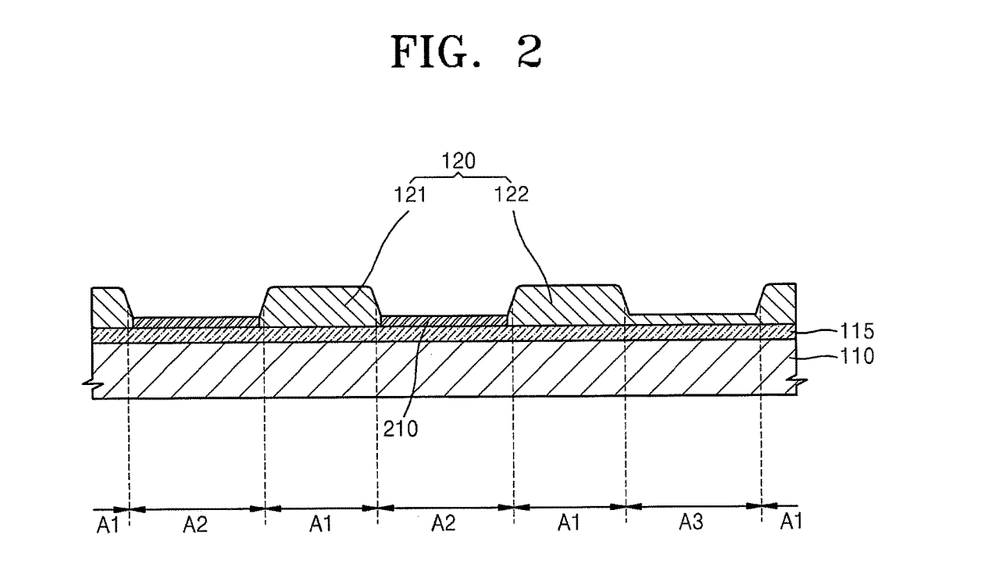

After the height adjustment layer 120 is formed on the substrate 110, a TFT is formed on the substrate 110 so as to correspond to the second area A2 of the substrate 110. However, the described technology is not limited to the TFT described hereinafter, and structures resulting in other height differences on the substrate 110, which will be described below, may be formed so as to correspond to the second area A2 of the substrate 110. Another layer or the like may be interposed between the height adjustment layer 120 and the structures, when required. For example, as illustrated in FIG. 2, first, a semiconductor layer 210 is formed in the second area A2 of the substrate 110. The semiconductor layer 210 may be formed as an amorphous silicon layer, an oxide silicon layer, or a polycrystalline silicon layer. Alternatively, the semiconductor layer 210 may be formed of an organic semiconductor material. Although not shown in detail in the drawing, the semiconductor layer 210 may include a source area and a drain area which are doped with a dopant, and a channel area, when required.

Figure 3:
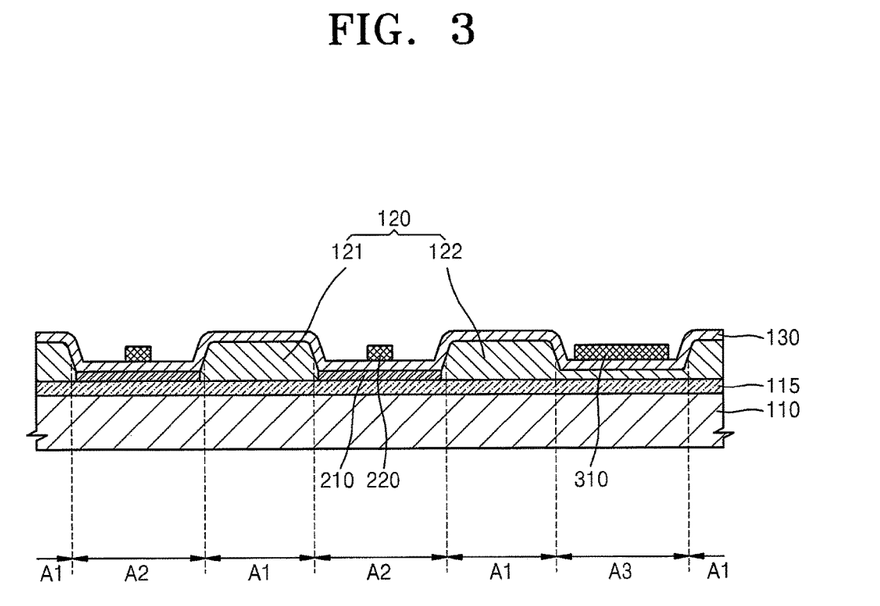

Thereafter, as illustrated in FIG. 3, a gate insulating layer 130 is formed so as to cover the semiconductor layer 210, and a gate electrode 220 is formed on the gate insulating layer 130. A first capacitor electrode 310 may be formed at substantially the same time as the gate electrode 220.

The gate insulating layer 130 may be ordinarily formed so as to cover both the first and second areas A1 and A2 of the height adjustment layer 120, that is, the whole surface of the height adjustment layer 120. The gate insulating layer 130 may be formed in a pattern, when required. The gate insulating layer 130 may be formed of silicon oxide, silicon nitride, or any electrically insulating organic or inorganic material. The gate electrode 220 may be formed to have a single-layered structure or a multi-layered structure using, for example, at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), or an arbitrary alloy type material, in consideration of the adhesion with an adjacent layer, surface flatness of a layer to be stacked thereon, and the processability thereof.

Figure 4:
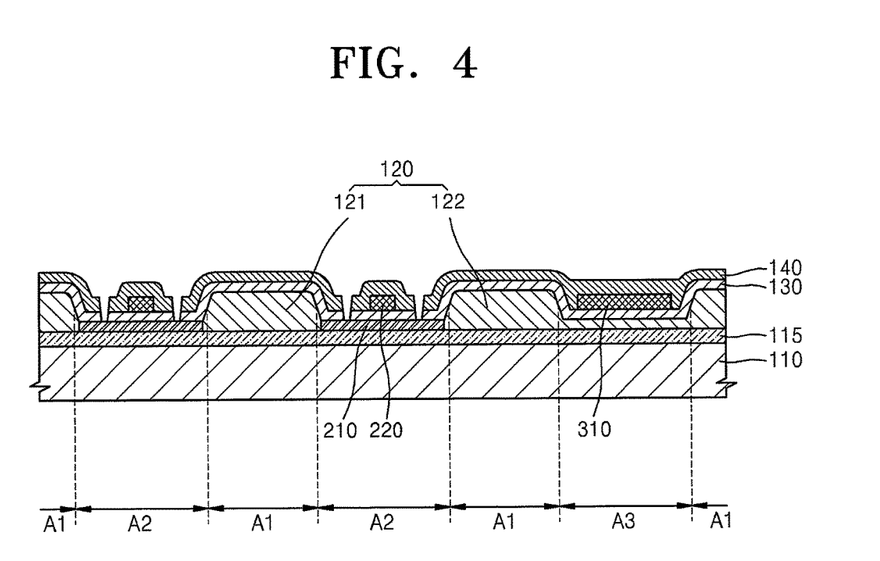
Figure 5:
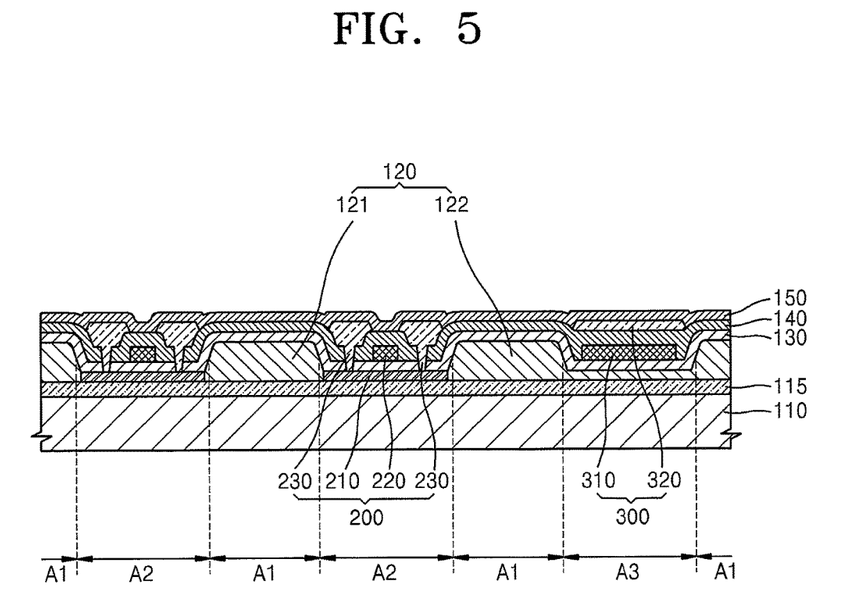

Subsequently, as illustrated in FIG. 4, an insulating interlayer 140 is formed of silicon oxide, silicon nitride, and/or any electrically insulating organic or inorganic material so as to cover the gate electrode 220 and the gate insulating layer 130. Then, contact holes are formed by removing portions of the gate insulating layer 130 and the insulating interlayer 140 so as to expose predetermined areas of the semiconductor layer 210. The insulating interlayer 140 may also be partially patterned when required. Thereafter, as illustrated in FIG. 5, source/drain electrodes 230 may be formed through the contact holes to contact the semiconductor layer 210, thereby forming a TFT 200. A second capacitor electrode 320 may be formed at substantially the same time as the source/drain electrodes 230. Thus, a capacitor 300 may be formed on the substrate 110. The source/drain electrodes 230 may be formed to have a single-layered structure or a multi-layered structure using, for example, at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), or an arbitrary alloy type material.

In addition, a passivation layer 150 is formed of silicon oxide, silicon nitride, and/or any electrically insulating organic or inorganic material so as to cover the source/drain electrodes 230 of the TFT 200 and the insulating interlayer 140. The passivation layer 150 is formed so as to cover the source/drain electrodes 230 and the insulating interlayer 140. The passivation layer 150 may be understood as being formed so as to cover the height adjustment layer 120 and the TFT 200. This is because the source/drain electrodes 230 are components of the TFT 200, or this is because covering the insulating interlayer 140 or the gate insulating layer 130 may be understood as covering the height adjustment layer 120 since the insulating interlayer 140 or the gate insulating layer 130 covers the height adjustment layer 120. Although not illustrated, the insulating interlayer 140 or the gate insulating layer 130 may be patterned, and thus a part of the height adjustment layer 120 may not be covered by the insulating interlayer 140 or the gate insulating layer 130. In this case, the passivation layer 150 may directly cover the height adjustment layer 120.

Figure 6:
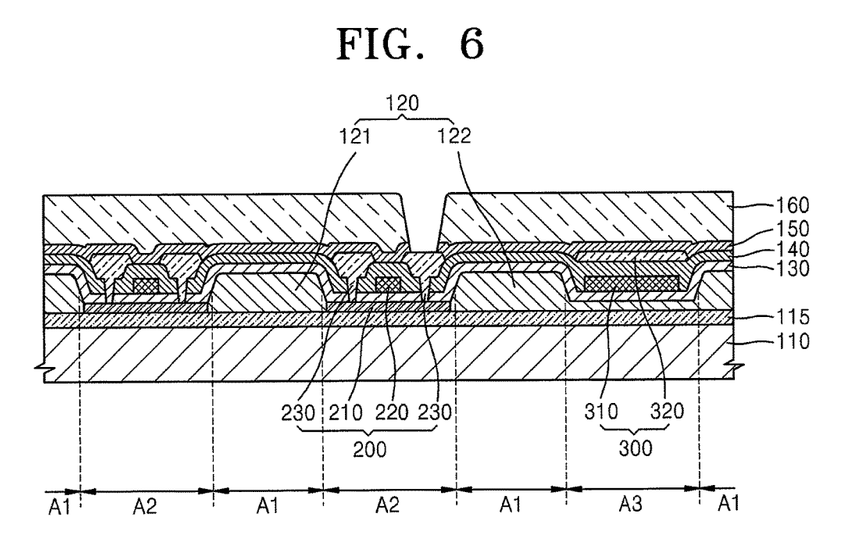

After the completion of this step in the method of the present embodiment, the passivation layer 150 covers the whole surface of the substrate 110 or the majority of the substrate 110. Here, as illustrated in FIG. 5, the TFT 200 having a complicated layered-structure is located below the passivation layer 150, and thus the top surface of the passivation layer 150 may not be sufficiently flat. However, the height adjustment layer 120 is formed below the passivation layer 150 so as to correspond to at least a part of the first area A1 of the substrate 110, and the TFT 200 is formed so as to correspond to the second area A2 of the substrate 110 in which the height adjustment layer 120 is not present. Thus, although the top surface of the passivation layer 150 is not flat, the passivation layer 150 does not have relatively large height differences in different areas thereof. This is also true of the third area A3 in which the capacitor 300 is formed. That is, the height h2 in the third area A3 of the height adjustment layer 120 may be previously set in consideration of the thicknesses of the first and second capacitor electrodes 310 and 320 of the capacitor 300. Accordingly, as illustrated in FIG. 6, when a planarization layer 160 is formed on the passivation layer 150, the planarization layer 160 may be formed so as to sufficiently planarize the top surface of the planarization layer 160.

Due to the formation of the height adjustment layer 120 the planarization layer 160 may be formed so as to sufficiently planarize the top surface of the planarization layer 160 by adjusting the height of the height adjustment layer 120 or selectively disposing the height adjustment layer 120 so that it is not disposed in an area in which other wiring structures are to be located. Hereinafter, for convenience of description, only the case where the TFT 200 is formed will be described.

The planarization layer 160 may be formed of an acryl-based organic material, polyimide, benzocyclobutene (BCB), or the like, and may be formed of silicon oxide or silicon nitride when required. An upper portion of the planarization layer 160 formed in this manner may be planarized using a mechanical method, such as milling, when required.

If the passivation layer 150 is not formed in the manufacturing process of the OLED display, the planarization layer 160 may be formed so as to cover the height adjustment layer 120 and the TFT 200. In this case, the planarization layer 160 is formed so as to cover the source/drain electrodes 230 and the insulating interlayer 140. The planarization layer 160 may be understood as being formed so as to cover the height adjustment layer 120 and the TFT 200. This is because the source/drain electrodes 230 are components of the TFT 200, or this is because covering the insulating interlayer 140 or the gate insulating layer 130 may be understood as covering the height adjustment layer 120 since the insulating interlayer 140 or the gate insulating layer 130 covers the height adjustment layer 120. Although not illustrated, the insulating interlayer 140 or the gate insulating layer 130 may be patterned, and thus a part of the height adjustment layer 120 may not be covered by the insulating interlayer 140 or the gate insulating layer 130. In this case, the planarization layer 160 may directly cover the height adjustment layer 120.

Figure 7:
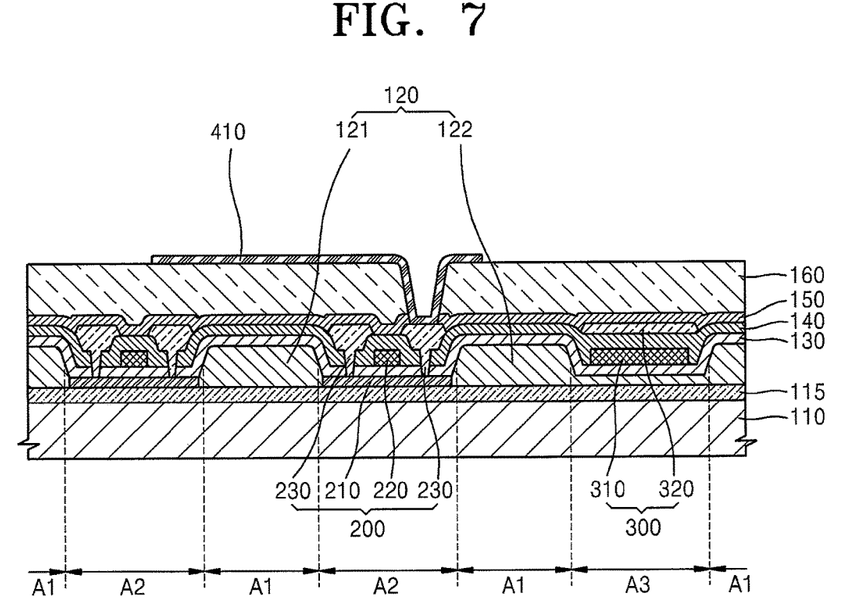
Figure 8:
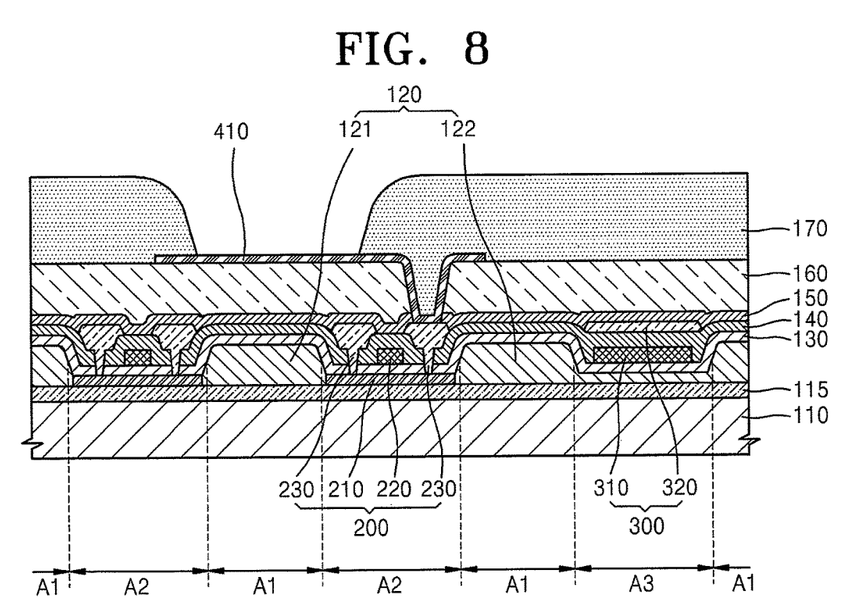

After the planarization layer 160 is formed, a via hole is formed in the passivation layer 150 and the planarization layer 160 so as to expose any one of the source/drain electrodes 230 of the TFT 200, as illustrated in FIG. 6. Subsequently, as illustrated in FIG. 7, a pixel electrode 410, which is electrically connected to the TFT 200, is formed on the planarization layer 160 via the via hole. Then, as illustrated in FIG. 8, a pixel defining layer 170 having a single-layered structure or a multi-layered structure may be formed of an organic material, such as polyacrylate or polyimide, or a material, such as an arbitrary inorganic material, and exposes a part of the pixel electrode 410, which includes the central portion of the pixel electrode 410.

The pixel electrode 410 may be formed as a (semi) transparent electrode or a reflective electrode. When the pixel electrode 410 is formed as a (semi)transparent electrode, the pixel electrode 410 may be formed of, for example, indium tin oxide (ITO), indium zinc oxide (IZO), zinc oxide (ZnO), indium oxide ($In_2O_3$), indium gallium oxide (IGO), or aluminium zinc oxide (AZO). When the pixel electrode 410 is formed as a reflective electrode, the pixel electrode 410 may include a reflective film formed of Ag, Mg, Al, Pt, Pd, Au, Ni, Nd, Ir, Cr, or a compound thereof, and a film formed of ITO, IZO, ZnO, or $In_2O_3$. However, the configuration and material of the pixel electrode 410 are not limited thereto, and various modifications may be made.

The pixel defining layer 170 may define pixels by having an opening corresponding to each sub-pixel, that is, an opening for exposing the central portion of the pixel electrode 410 or the whole pixel electrode 410. In addition, the pixel defining layer 170 may substantially prevent current leakage or the like from occurring between end portions of the pixel electrode 410 and a counter electrode 430 by increasing a distance between the end portions of the pixel electrode 410 and the counter electrode 430 (see FIG. 10).

Figure 9:
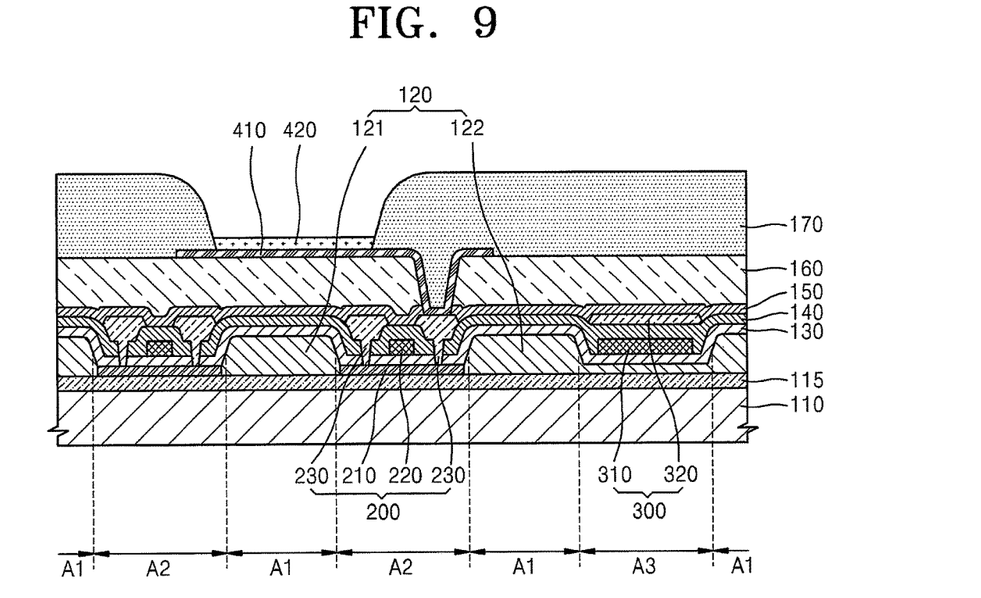
Figure 10:
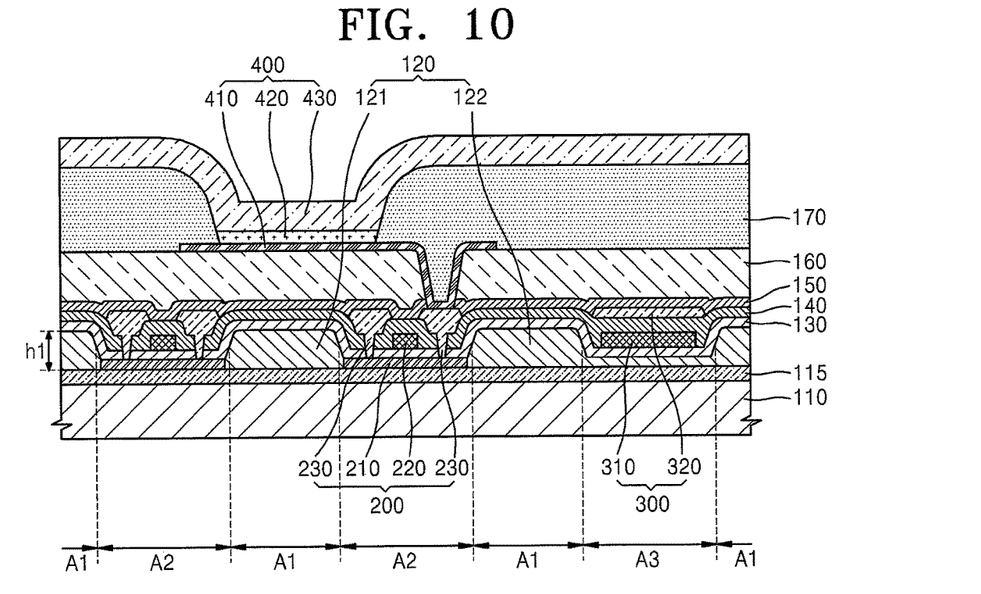
FIG. 10 is a schematic cross-sectional view illustrating an OLED display according to another embodiment.

Thereafter, as illustrated in FIG. 9, an intermediate layer 420, including an emission layer, is formed, and the counter electrode 430 is formed so as to correspond to at least the pixel electrode 410 or to correspond to the majority of the area of the substrate 110, thus completing the manufacture of the OLED display, including an OLED 400, which is electrically connected to the TFT 200, as illustrated in FIG. 10.

The counter electrode 430 is formed as a single body in a plurality of pixels to cover a display area (active area). Here, the display area refers to all areas capable of emitting light in the whole OLED display. For example, the display area may refer to all areas except for the edges of the OLED display at which, for example, a controller or the like is located. When a dead area is not present in the whole surface of the OLED display, the whole surface of the OLED display may be referred to as a display area.

The counter electrode 430 may receive an electrical signal from an electrode power supply line through electrical contact with the electrode power supply line outside the display area. The counter electrode 430 may be formed as a (semi)transparent electrode or a reflective electrode. When the counter electrode 430 is formed as a (semi)transparent electrode, the counter electrode 430 may include a film that is formed of Li, Ca, LiF/Ca, LiF/Al, Al, Mg, or a compound thereof so as to face the intermediate layer 420, and an auxiliary electrode or a bus electrode line, which is formed of a (semi)transparent material, such as ITO, IZO, ZnO, or $In_2O_3$. When the counter electrode 430 is formed as a reflective electrode, the counter electrode 430 may include a layer including, for example, at least one material of Li, Ca, LiF/Ca, LiF/Al, Al, Ag, or Mg. However, the configuration and material of the counter electrode 430 are not limited thereto, and various modifications may be made.

In the OLED display manufactured in this manner, the height adjustment layer 120 having the height h1 is formed so as to correspond to at least a part of the first area A1 of the substrate 110, and the TFT 200 is formed so as to correspond to the second area A2 of the substrate 110 in which the height adjustment layer 120 is not present. Thus, even when the surface below the planarization layer 160 is not completely flat when forming the planarization layer 160, the planarization layer 160 may be formed to have a substantially flat top surface. Accordingly, the pixel electrode 410 on the planarization layer 160 may also be formed to be substantially flat. Thus, the intermediate layer 420 may be formed to have a substantially uniform thickness when forming the intermediate layer 420, including an emission layer, on the pixel electrode 410.

Figure 11:
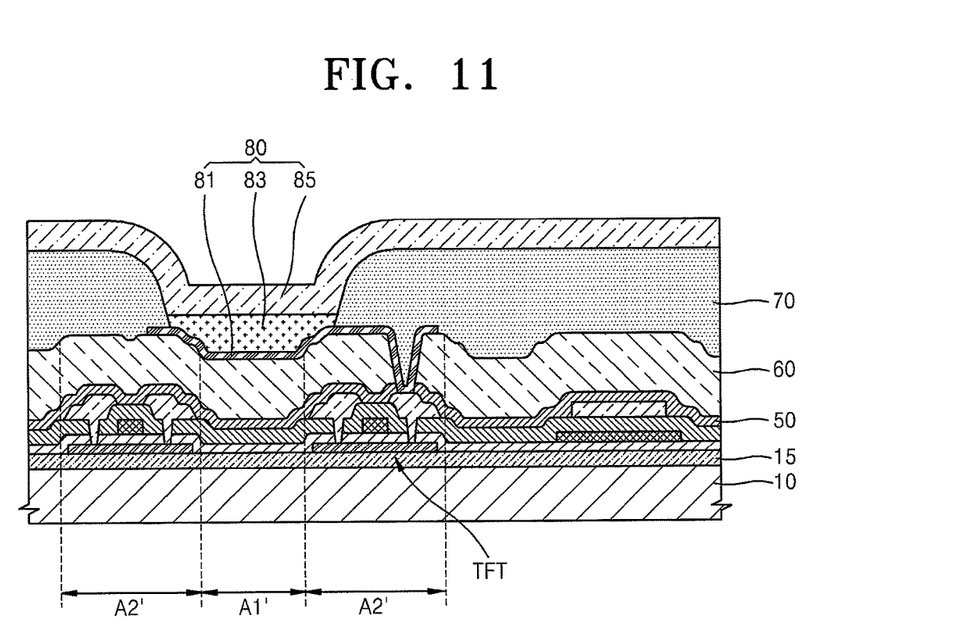
FIG. 11 is a schematic cross-sectional view illustrating an OLED display according to a comparative example.

FIG. 11 is a schematic cross-sectional view illustrating an OLED display according to a comparative example. As illustrated in FIG. 11, in the OLED display according to the comparative example which does not include a height adjustment layer, a TFT is formed on a buffer layer 15 on a substrate 10, a passivation layer 50 and a planarization layer 60 are formed so as to cover the TFT, and a pixel electrode 81 is formed on the planarization layer 60. Further, a pixel defining layer 70 is formed on the planarization layer 60 and the pixel electrode 81, an intermediate layer 83, including an emission layer, is formed on the pixel electrode 81, and a counter electrode 85 is formed on the intermediate layer 83, thereby manufacturing the TFT and an OLED 80 that are electrically connected to each other.

However, since the OLED display according to the comparative example does not include a height adjustment layer, the top surface of the passivation layer 50 has a relatively large height difference between a first area A1' in which a TFT is not formed and a second area A2' in which a TFT is formed. Thus, when the planarization layer 60 covering the passivation layer 50 is formed, even though the planarization layer 60 has a height difference smaller than the height difference of the top surface of the passivation layer 50, the top surface of the planarization layer 60 still has a relatively large height difference in areas thereof.

As a result, in the OLED display according to the comparative example, the pixel electrode 81 is formed on the planarization layer 60 in a curved area of the top surface of the planarization layer 60. Thus, when the whole or a part of the intermediate layer 83, including the emission layer, is formed on the pixel electrode 81 through a liquid phase process, for example, by inkjet printing, nozzle printing, or the like, the intermediate layer 83 is formed to have a substantially flat top surface, irrespective of the curvature of the pixel electrode 81 located under the intermediate layer 83, since the material used in forming the intermediate layer 83 is a liquid phase material. Consequently, the intermediate layer 83 having a non-uniform thickness is formed on the pixel electrode 81. Referring to FIG. 11, a portion of the intermediate layer 83, which is included in the second area A2', has a smaller thickness than that of a portion of the intermediate layer 83, which is included in the first area A1'.

Such a difference in thickness of the intermediate layer 83 results in a difference in the amount of light emitted from the OLED 80. That is, based on an ordinary experiment, electrons and holes are more easily injected in the portion of the intermediate layer 83 which has a small thickness, and thus brightness of this portion is high. On the other hand, electrons and holes are not easily injected in the portion of the intermediate layer 83 which has a large thickness, and thus brightness of this portion is low. Therefore, a problem occurs in that light emitted from within each sub-pixel has a non-uniform brightness.

However, according to the method of manufacturing an OLED display of the current embodiment, before forming the TFT 200, the height adjustment layer 120 having the height h1 is formed so as to correspond to at least a part of the first area A1 of the substrate 110, and the TFT 200 is formed so as to correspond to the second area A2 of the substrate 110 in which the height adjustment layer 120 is not present. Thus, even though the top surface of the passivation layer 150 covering the height adjustment layer 120 and the TFT 200 is not completely flat, the vertical difference in height between areas thereof is not as large as in the OLED display according to the comparative example.

As such, since the top surface of the passivation layer 150 does not have a great difference in height between areas thereof, the planarization layer 160 covering the passivation layer 150 has a sufficiently flat top surface, and thus the pixel electrode 410 on the planarization layer 160 is also formed to be substantially flat. Accordingly, even though the intermediate layer 420, including the emission layer, is formed through a liquid phase process, the intermediate layer 420 may be formed to have a substantially uniform thickness. Thus, the brightness uniformity of light emitted within each sub-pixel may be increased, thereby drastically increasing the quality of the OLED display and increasing the manufacturing yield thereof. In addition, the whole intermediate layer 420 is not required to be formed through a liquid phase process. That is, a part thereof may be formed by deposition or the like, and another part thereof may be formed through a liquid phase process.

When the intermediate layer 420 is formed of a liquid phase material, the intermediate layer 420 may have a structure including at least one or all of a hold injection layer (HIL), a hole transport layer (HTL), an interlayer (or a primer layer), or an emission layer (EML). Examples of a material for forming the intermediate layer 420 may include a high molecular material, a low molecular material, or a dendrimer material which is in a liquid phase.

Examples of a material for forming the HTL may include poly-3,4-ethylene-dihydroxy thiophene (PEDOT), polyaniline (PANI), doped or undoped polythiophene, a p-doped material, or the like. Examples of a material for forming the EML may include a high molecular material, a low molecular material (ordinarily, a soluble low molecular material), or a dendrimer material, which emits light in the form of fluorescence or phosphorescence and is capable of being manufactured in a liquid phase. A material based on poly-phenylene vinylene (PPV) or polyfluorene may be used as the liquid high molecular material. Examples of the low molecular material may include an ordinary low molecular material or a liquefiable material including a material which is particularly designed for a liquid phase process, and a functional group capable of liquefying the material.

As such, in a case where the pixel defining layer 170 is formed through a liquid phase process, when a liquid phase material is applied onto the pixel electrode 410, a portion of the surface of the pixel defining layer 170, which is to come into contact with the liquid phase material, that is, a portion of the pixel defining layer 170 which is adjacent to the pixel electrode 410, may be formed of a material having a high wettability because of a slightly high surface energy thereof, like silicon nitride or silicon oxide, and the remaining portions thereof may be formed of an organic material. That is, at least a part of the opening for defining the pixel of the pixel defining layer 170 may be formed of a material different from a material for forming other portions of the pixel defining layer 170. At this time, the surface energy of the material for forming the part of the opening may be higher than that of the material for forming other portions of the pixel defining layer 170. In particular, a liquid phase material may be concentrated on the side of the pixel electrode 410 rather than the top surface of the pixel defining layer 170 during the liquid phase process by increasing the surface energy of the material for forming other portions of the pixel defining layer 170.

The surface energy may be adjusted by temporarily or permanently changing surface energy of a surface to be processed, through a method of irradiating plasma or light having a specific wavelength.

In a bottom emission type OLED display in which light emitted from the emission layer is emitted to the environment through the pixel electrode 410 and the substrate 110 below the pixel electrode 410, when the TFT 200 or other wiring structures are present below the pixel electrode 410, the emission of the light may be restricted. In some embodiments, a bottom emission type OLED display does not include any structure below the pixel electrode 410 which has a substantially non-uniform surface.

Alternatively, in a top emission type OLED display in which light emitted from the emission layer is emitted to the environment through the counter electrode 430, it is highly likely that a structure having a non-uniform surface, such as the TFT 200, is formed below the pixel electrode 410. Accordingly, in the top emission type OLED display, it may be particularly effective to improve the emission properties of the OLED display by substantially planarizing the top surface of the planarization layer 160 or the like on which the pixel electrode 410 is to be formed, through the use of the height adjustment layer 120 as described above.

In order to reduce the differences in height in areas of the top surface of the passivation layer 150 located under the planarization layer 160, when forming the height adjustment layer 120, the height h1 of the height adjustment layer 120 may be formed to correspond to the height of the TFT 200. Thus, when the TFT 200 is formed in the second area A2 of the substrate 110 in which the height adjustment layer 120 is not present, after the TFT 200 is formed, a difference in height between the top surface in the second area A2 in which the TFT 200 is formed and the top surface in the first area A1 in which the TFT 200 is not formed may be minimized. Here, the top surface may refer to the top surface of the portion other than the passivation layer 150 in FIG. 5, that is, the top surface of the TFT 200 at a location where the TFT 200 is formed, and may refer to the top surface of the insulating interlayer 140 in FIG. 5 at a location where the TFT 200 is not formed.

The correspondence of the height h1 of the height adjustment layer 120 to the height of the TFT 200 does not mean that the height h1 of the height adjustment layer 120 is substantially the same as the height of the TFT 200. For example, as illustrated in FIG. 5, the gate insulating layer 130 or the insulating interlayer 140 may be required in forming the TFT 200, and thus the gate insulating layer 130 or the insulating interlayer 140 may be formed in an area where the TFT 200 is not formed (so as to cover the height adjustment layer 120). Accordingly, the height h1 of the height adjustment layer 120 may be slightly less than the height of the TFT 200 (for example, the height from the bottom of the semiconductor layer 210 to the top surfaces of the source/drain electrodes 230).

Before forming the TFT 200, when forming the height adjustment layer 120, the thickness thereof in the first area A1 is precisely adjusted, and thus, the passivation layer 150 covering the height adjustment layer 120 and the TFT 200 may be formed to have a substantially flat top surface. In this case, a substantially flat pixel electrode may be formed on the passivation layer 150 without having to form an additional passivation layer, and thus, even though at least a part of the intermediate layer is formed using a method including a liquid phase process, the part of the intermediate layer may be formed to have a substantially uniform thickness.

Figure 12:
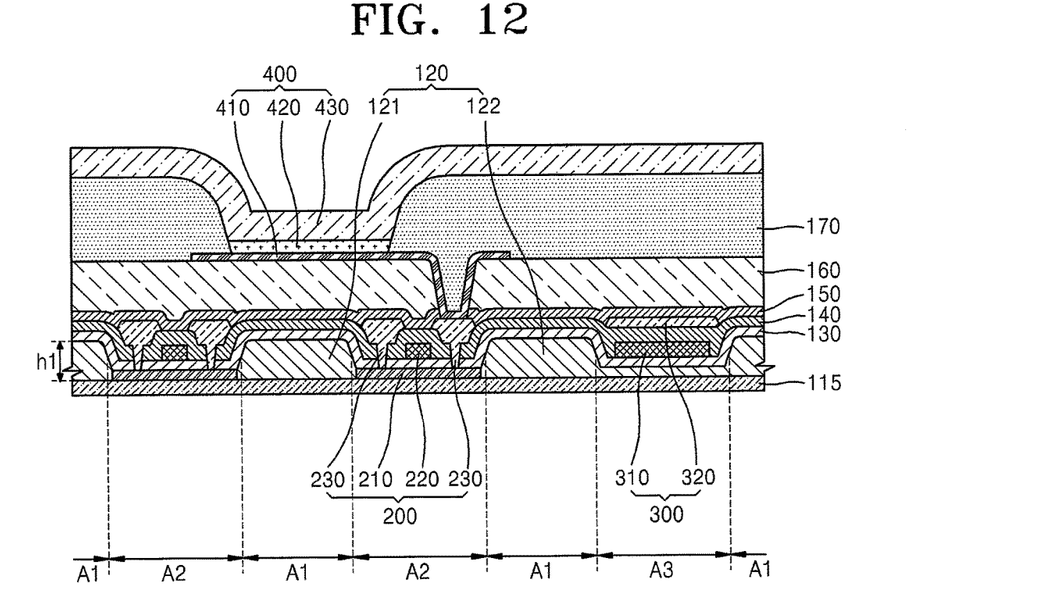
FIG. 12 is a schematic cross-sectional view illustrating an OLED display according to another embodiment.

In a method of manufacturing an OLED display according to another embodiment, a process of removing the substrate 110 may be additionally performed as illustrated in FIG. 12. In this case, the buffer layer 115 is exposed to the environment to serve as a substrate. When the buffer layer 115 is not formed, a layer that is finally exposed to the environment by removing the substrate 110 may serve as a substrate.

When the OLED display is manufactured, processes of forming and patterning various layers are performed. Thus, the OLED display is manufactured through a process of passing the substrate 110 through various chambers. In this process, handling stability is highly significant, and a substrate 110 having a sufficient thickness may be used. In consideration of this, the handling stability is increased by using a substrate 110 having a sufficient thickness, and subsequently the substrate 110 may be removed, thereby allowing a thin OLED display to be manufactured.

In order to manufacture a flexible OLED display, a considerable number of layers are required to have flexibility. However, such a flexible OLED display will have a decreased handling stability. Accordingly, the handling stability may be increased by using a substrate 110 having a sufficient thickness and solidity, and then the substrate 110 may be removed, thereby allowing for the manufacture of a flexible OLED display. In particular, in the method of manufacturing an OLED display according to the current embodiment, as in a case where the height adjustment layer 120 includes the first and second height adjustment layers 121 and 122, which are separated from each other, the height adjustment layer 120 is formed to have a patterned island shape, and thus even though the height adjustment layer 120 is formed of a metal or an inorganic material, the height adjustment layer 120 may not affect the flexibility of the OLED display.

As such, the process of removing the substrate 110 is not necessarily required to be performed after forming the counter electrode 430 or after forming the counter electrode 430 and then forming a sealing layer (not shown), and other various modifications may be made. For example, as illustrated in FIG. 5, after the passivation layer 150 covering the TFT 200 is formed, the substrate 110 may be removed, and then the process of forming the planarization layer 160 may be performed. Alternatively, as illustrated in FIG. 7, after the pixel electrode 410 is formed, the substrate 110 may be removed, and then the process of forming the pixel defining layer 170 may be performed. Alternatively, after the pixel defining layer 170 is formed, the substrate 110 may be removed. As illustrated in FIG. 5, the substrate 110 may be removed before forming the passivation layer 150.

Although a case where the height adjustment layer 120 is formed on the substrate 110 or the buffer layer 115 has been described, the described technology is not limited thereto.

Figure 13:
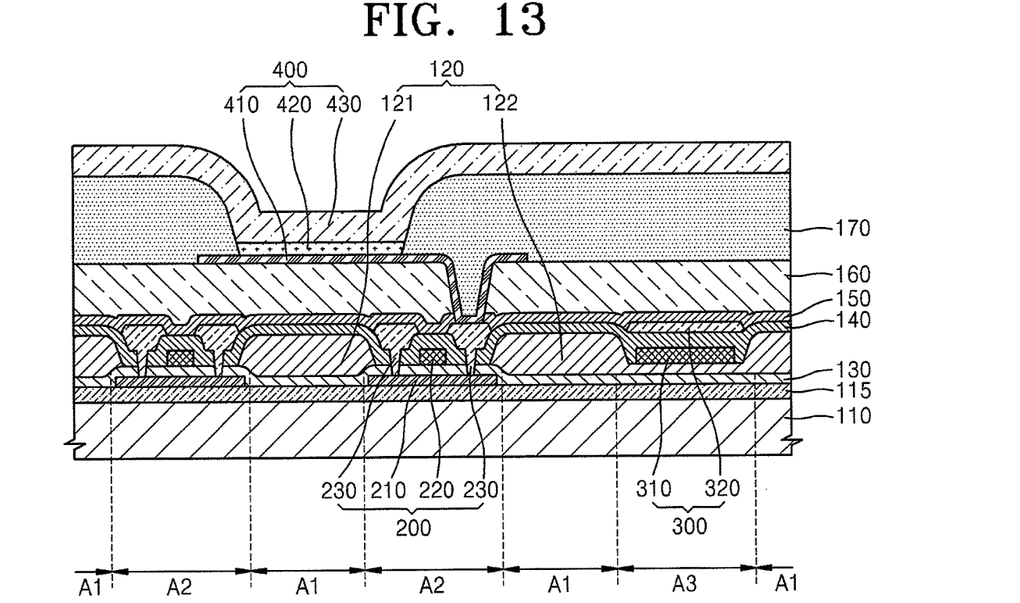
FIG. 13 is a schematic cross-sectional view illustrating an OLED display according to another embodiment.

For example, in a method of manufacturing an OLED display according to another embodiment as illustrated in FIG. 13, the gate insulating layer 130 interposed between the semiconductor layer 210 and the gate electrode 220 of the TFT 200 may be formed so as to cover the whole surface of the substrate 110 or the majority of the substrate 110, and the height adjustment layer 120 may be formed on the gate insulating layer 130 so as to correspond to at least a part of the first area A1 of the substrate 110. That is, the height adjustment layer 120 may be formed after forming the gate insulating layer 130 or after forming the gate electrode 220. In this case, the insulating interlayer 140 may be formed so as to cover not only the gate insulating layer 130 and the gate electrode 220 but also the height adjustment layer 120. Thus, the passivation layer 150 covering the TFT 200 and the insulating interlayer 140 may have a substantially flat top surface, in spite of the presence of the TFT 200 disposed below the passivation layer 150.

Figure 14:
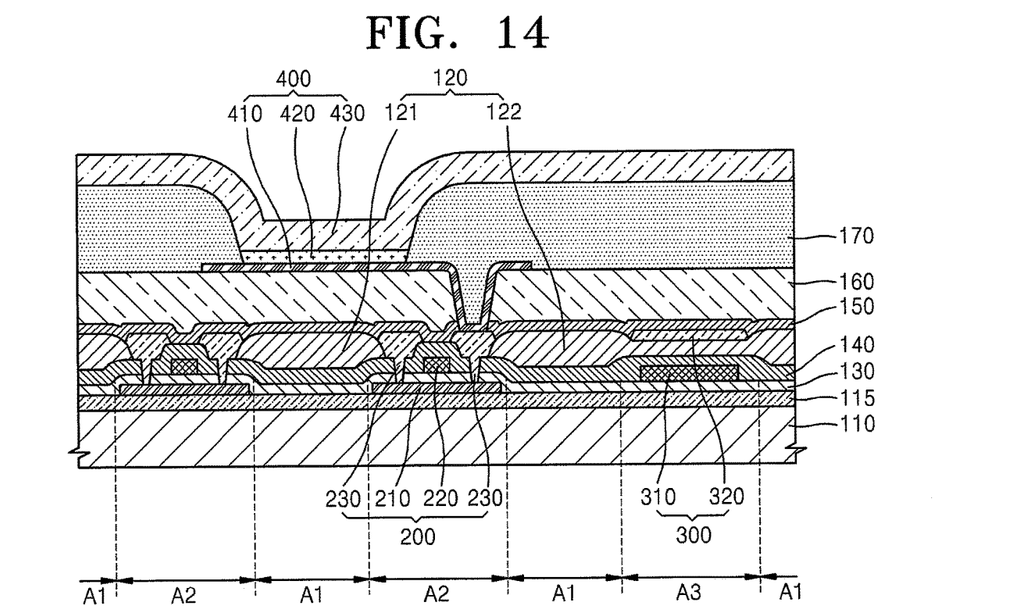
FIG. 14 is a schematic cross-sectional view illustrating an OLED display according to another embodiment.

Alternatively, in a method of manufacturing an OLED display according to another embodiment as illustrated in FIG. 14, the insulating interlayer 140 covering the gate insulating layer 130 and interposed between the gate electrode 220 and the source/drain electrodes 230 of the TFT 200 may be formed so as to cover the whole surface of the substrate 110 or the majority of the substrate 110, and the height adjustment layer 120 may be formed on the insulating interlayer 140 so as to correspond to at least a part of the first area A1 of the substrate 110. That is, the height adjustment layer 120 may be formed on the insulating interlayer 140 after forming the insulating interlayer 140 or after forming the source/drain electrodes 230 when required. In this case, the passivation layer 150 may be formed so as to cover not only the TFT 200 but also the height adjustment layer 120. Thus, the passivation layer 150 may be formed to have a substantially flat top surface in spite of the presence of the TFT 200 disposed below the passivation layer 150.

Although methods of manufacturing an OLED display has been described, the described technology is not limited thereto. For example, a method of manufacturing a TFT substrate is also included in the scope of the described technology.

Here, a TFT substrate refers to a substrate 110 including a TFT 200 formed on the substrate 110. Alternatively, the TFT substrate may refer to a substrate including a height adjustment layer 120, a TFT 200, and a passivation layer 150 covering the height adjustment layer 120 and the TFT 200 formed on the substrate 110, as illustrated in FIG. 5. Alternatively, the TFT substrate may refer to a substrate including a height adjustment layer 120, a TFT 200, a passivation layer 150, and a planarization layer 160 formed on the substrate 110, as illustrated in FIG. 6. Alternatively, the TFT substrate may refer to a substrate including a height adjustment layer 120, a TFT 200, a passivation layer 150, a planarization layer 160, and a pixel electrode 410 formed on the substrate 110, as illustrated in FIG. 7. Alternatively, the TFT substrate may refer to a substrate as illustrated in FIG. 5 where only the TFT 200, and not the passivation layer 150, is formed on the substrate 110.

The method of manufacturing the TFT substrate according to the current embodiment may include any of the steps previously described in the method of manufacturing an OLED display while excluding some of the steps.

That is, the method of manufacturing a TFT substrate according to the current embodiment may include a step of forming the height adjustment layer 120 having the height h1 on the substrate 110 so as to correspond to at least a part of the first area A1 of the substrate 110, as illustrated in FIG. 1, and a step of forming the TFT 200 so as to correspond to the second area A2 of the substrate 110, which is an area where the height adjustment layer 120 is not present, after the processes illustrated in FIGS. 2 to 5.

The height adjustment layer 120 may be formed of, for example, metal or an inorganic material. When the height adjustment layer 120 is formed of metal, the metal may be a material that may be used when forming a gate electrode which is a component of a TFT. That is, the height adjustment layer 120 may be formed to have a single-layered structure or a multi-layered structure using, for example, at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), or an arbitrary alloy type material. When the height adjustment layer 120 is formed of an inorganic material, the height adjustment layer 120 may be formed to have a single-layered structure or a multi-layered structure using a material, such as silicon oxide and/or silicon nitride.

At this time, the step of forming the height adjustment layer 120 may be an step of forming the height adjustment layer 120 in such a manner that the height h1 of the height adjustment layer 120 corresponds to the height of the TFT 200. Thus, when the TFT 200 is formed in the second area A2 of the substrate 110, which is an area where the height adjustment layer 120 is not present, after the TFT 200 is formed, a difference in height between the top surface in the second area A2 in which the TFT 200 is formed and the top surface in the first area A1 in which the TFT 200 is not formed may be minimized.

The correspondence of the height h1 of the height adjustment layer 120 to the height of the TFT 200 does not mean that the height h1 of the height adjustment layer 120 is substantially the same as the height of the TFT 200, which is as described in the method of manufacturing an OLED display.

The method of manufacturing the TFT substrate, according to the current embodiment, may further include a step of forming the planarization layer 160 so as to cover the height adjustment layer 120 and the TFT 200. Alternatively, the passivation layer 150 is formed as illustrated in FIG. 5, and then the planarization layer 160 may be formed on the passivation layer 150 as illustrated in FIG. 6. Under different conditions, the method of manufacturing the TFT substrate, according to the current embodiment, may include a step of forming the pixel electrode 410 on the planarization layer 160 so as to be electrically connected to the TFT 200 through a via hole.

The method of manufacturing the TFT substrate, according to the current embodiment, may include a step of removing the substrate 110. In this case, the height adjustment layer 120 may substantially serve as a substrate. If another layer, such as the buffer layer 115, is formed on the substrate 110, the other layer may substantially serve as a substrate or a layer that is externally exposed, after removing the substrate 110, and other various modifications may be made. For example, the step for removing the substrate 110 may be performed before or after forming the TFT 200, or may be performed after forming the planarization layer 160.

In addition, other various modifications may be made to the location of the height adjustment layer 120. For example, the height adjustment layer 120 may be located on the substrate 110 or the buffer layer 115, may be located on the gate insulating layer 130 as illustrated in FIG. 13, or may be located on the insulating interlayer 140 as illustrated in FIG. 14.

The described technology does not include only the method of manufacturing an OLED display and the method of manufacturing a TFT substrate. The described OLED display and TFT substrate may also be included in the scope of the described technology.

The OLED display according to an embodiment of the described technology may have a configuration as illustrated in FIG. 10. That is, the OLED display may include the substrate 110, the height adjustment layer 120 having the height h1 and disposed on the substrate 110 so as to correspond to at least a part of the first area A1 of the substrate 110, and the TFT 200 disposed so as to correspond to the second area A2 of the substrate 110, which is an area where the height adjustment layer 120 is not present. The OLED display may further include the planarization layer 160 located over the height adjustment layer 120 and the TFT 200 and having a substantially flat top surface, and the OLED 400 that is electrically connected to the TFT 200. The height adjustment layer 120 may include a metal or an inorganic material as described above.

In the OLED display according to the current embodiment, differences in height over areas to be planarized by the planarization layer 160 may be minimized due to the presence of the height adjustment layer 120, and thus the top surface of the planarization layer 160 may be substantially planarized. As a result, the intermediate layer 420 including the emission layer, which is formed through a liquid phase process, is formed to have a substantially uniform thickness, thereby realizing a high-quality OLED display that emits light having a substantially uniform brightness within each sub-pixel.

The height h1 of the height adjustment layer 120 may correspond to the height of the TFT 200. Thus, a difference in height between the top surface in the second area A2 in which the TFT 200 is located and the top surface in the first area A1 in which the TFT 200 is not located may be minimized.

The correspondence of the height h1 of the height adjustment layer 120 to the height of the TFT 200 does not mean that the height h1 of the height adjustment layer 120 is substantially the same as the height of the TFT 200, as described in the method of manufacturing an OLED display.

The OLED display may further include the passivation layer 150 disposed between the height adjustment layer 120 and the TFT 200 and the planarization layer 160. The passivation layer 150 may prevent impurities below the passivation layer 150 from affecting the OLED 400 disposed above the passivation layer 150.

An OLED display according to another embodiment of the described technology as illustrated in FIG. 12 may not include the substrate 110 as a component. In this case, the buffer layer 115 may serve as a substrate. In addition, other configurations are the same as or similar to the configurations of the OLED display according to the previous embodiment described with reference to FIG. 10.

In contrast to the OLED display according to the previous embodiment described with reference to FIG. 10, the OLED display according to the current embodiment does not include the substrate 110, and thus a thin OLED display may be realized. In addition, the OLED display according to the current embodiment may be configured in such a manner that the substrate 110 having a low flexibility is not formed and a considerable number of components of the OLED display are formed to have flexibility, and thus a flexible OLED display may be realized.

Referring to FIGS. 13 and 14 illustrating OLED displays according to other embodiments, the height adjustment layer 120 may be located on the gate insulating layer 130 or the insulating interlayer 140.

Although OLED displays have been described, the described technology is not limited thereto. For example, the described technology may be applied to an OLED lighting apparatus, or any OLED display including a height adjustment layer, a TFT, and an OLED may be included in the scope of the described technology.

A TFT substrate according to another embodiment may include any of the components described in the OLED display of the previous embodiments while excluding some of the components.

That is, the TFT substrate according to the current embodiment may include the substrate 110, the adjustment layer 120 having the height h1 on the substrate 110 so as to correspond to at least a part of the first area A1 of the substrate 110, and the TFT 200, as illustrated in FIG. 5. The TFT substrate may further include the passivation layer 150 as illustrated in FIG. 5, and may further include the planarization layer 160 as illustrated in FIG. 6. In the latter case, the passivation layer 150 may not be formed when required. Under different conditions, the TFT substrate according to the current embodiment may also include the pixel electrode 410 disposed on the planarization layer 160 so as to be electrically connected to the TFT 200 through a via hole.

The height h1 of the height adjustment layer 120 may correspond to the height of the TFT 200. Thus, a difference in height between the top surface in the second area A2 in which the TFT 200 is located and the top surface in the first area A1 in which the TFT 200 is not located may be minimized when the TFT 200 is disposed in the second area A2 of the substrate 110, which is an area where the height adjustment layer 120 is not present.

The correspondence of the height h1 of the height adjustment layer 120 to the height of the TFT 200 does not mean that the height h1 of the height adjustment layer 120 is substantially the same as the height of the TFT 200, as described in the method of manufacturing an OLED display.

A TFT substrate according to another embodiment may not include the substrate 110 as a component in the TFT substrate described above. In this case, the buffer layer 115 may serve as a substrate. In addition, other configurations of the TFT substrate are the same as or similar to the configurations of the TFT substrate according to the previous embodiment described above.

Since the TFT substrate according to the current embodiment does not include the substrate 110, a thin TFT substrate may be realized. In addition, the TFT substrate may be configured in such a manner the substrate 110 having a low flexibility is not formed and a considerable number of components of the TFT substrate are formed to have flexibility, and thus a flexible TFT substrate may be realized.

As described above, according to at least one embodiments, a TFT substrate, which has a reduced height difference so as to facilitate a subsequent process, an OLED display including the TFT substrate, a method of manufacturing the TFT substrate, and a method of manufacturing the OLED display may be realized.

It should be understood that the exemplary embodiments described therein should be considered in a descriptive sense only and not for purposes of limitation. Descriptions of features or aspects within each embodiment should be considered as interchangeable with other similar features or aspects in other embodiments.

While embodiments of the described technology have been described with reference to the figures, it will be understood by those of ordinary skill in the art that various changes in form and details may be made therein without departing from the spirit and scope of the described technology as defined by the accompanying claims.

What is claimed is:
1. A thin film transistor (TFT) substrate, comprising:
a substrate including first and second areas which do not overlap each other;
a height adjustment layer formed over the substrate; and
a TFT including a gate electrode and formed over the substrate in an area corresponding to the second area, wherein the TFT further includes a semiconductor layer and source and drain electrodes, the source and drain electrodes including source and drain portions that overlap the semiconductor layer in the depth dimension of the TFT substrate and do not overlap the height adjustment layer in the depth dimension of the TFT substrate, wherein the TFT includes a first TFT and a second TFT adjacent to each other, and wherein the height adjustment layer is formed between the first and second TFTs; and
a pixel electrode electrically connected to the TFT, the pixel electrode being over the TFT and the height adjustment layer,
wherein the distance between a top surface of the substrate and a top surface of the height adjustment layer is equal to or larger than the distance between the top surface of the substrate and a top surface of the gate electrode throughout the substrate, and
wherein the height adjustment layer and the gate electrode do not overlap each other in the depth dimension, wherein the height adjustment layer comprises first and second height adjustment layers which have different heights, and wherein the first height adjustment layer overlaps the pixel electrode in the depth dimension of the TFT substrate, and the second height adjustment layer does not overlap the pixel electrode in the depth dimension of the TFT substrate.

2. The TFT substrate of claim 1, wherein the height of the first height adjustment layer is substantially similar to the height of the TFT.

3. The TFT substrate of claim 1, wherein the height adjustment layer is formed of metal or an inorganic material.

4. The TFT substrate of claim 1, further comprising a planarization layer substantially covers the height adjustment layer and the TFT.

5. The TFT substrate of claim 4, further comprising a passivation layer formed between i) the height adjustment layer and the TFT and ii) the planarization layer.

6. The TFT substrate of claim 1, wherein the first and second height adjustment layers are separated from each other.

7. The TFT substrate of claim 1, further comprising a buffer layer formed between the substrate and the height adjustment layer.

8. The TFT substrate of claim 1, further comprising a gate insulating layer formed over the substrate and including first and second portions respectively formed in the first and second areas, wherein the TFT comprises:
the second portion of the gate insulating layer,
wherein the second portion of the gate insulating layer is formed between the semiconductor layer and the gate electrode, and
wherein the first height adjustment layer is formed over the first portion of the gate insulating layer.

9. The TFT substrate of claim 1, further comprising an insulating interlayer formed over the substrate and including first and second portions respectively in the first and second areas,
wherein the second portion of the insulating interlayer is formed between the gate electrode and the source and drain electrodes, and
wherein the first height adjustment layer is formed over the first portion of the insulating interlayer.

10. The TFT substrate of claim 1, further comprising a gate insulating layer covering the height adjustment layer and contacting a bottom surface of the gate electrode.

11. The thin film transistor (TFT) substrate of claim 1, further comprising a capacitor, wherein the second height adjustment is disposed directly below the capacitor.

12. An organic light-emitting diode (OLED) display, comprising:
a thin film transistor (TFT) substrate comprising:
a substrate including first and second areas which do not overlap each other;
a height adjustment layer formed over the substrate;
a TFT including a gate electrode and formed over the substrate in an area corresponding to the second area, wherein the TFT further includes a semiconductor layer and source and drain electrodes, the source and drain electrodes including source and drain portions that overlap the semiconductor layer in the depth dimension of the TFT substrate and do not overlap the height adjustment layer in the depth dimension of the TFT substrate, wherein the TFT includes a first TFT and a second TFT adjacent to each other, and wherein the height adjustment layer is formed between the first and second TFTs;
a pixel electrode electrically connected to the TFT, the pixel electrode being over the TFT and the height adjustment layer,
wherein the distance between a top surface of the substrate and a top surface of the height adjustment layer is equal to or larger than the distance between the top surface of the substrate and a top surface of the gate electrode throughout the substrate, and
wherein the height adjustment layer and the gate electrode do not overlap each other in the depth dimension of the TFT substrate;
an intermediate layer formed over the pixel electrode and comprising an emission layer; and
a counter electrode formed over the intermediate layer,
wherein the height adjustment layer comprises first and second height adjustment layers which have different heights, and wherein the first height adjustment layer overlaps the pixel electrode in the depth dimension of the TFT substrate, and the second height adjustment layer does not overlap the pixel electrode in the depth dimension of the TFT substrate.

13. The OLED display of claim 12, wherein the emission layer is configured to emit light to the environment through the counter electrode.

* * * * *